United States Patent [19]

Mitzlaff

[11] Patent Number: 4,636,741
[45] Date of Patent: Jan. 13, 1987

[54] MULTI-LEVEL POWER AMPLIFYING CIRCUITRY FOR PORTABLE RADIO TRANSCEIVERS

[75] Inventor: James E. Mitzlaff, Carpentersville, Ill.

[73] Assignee: Motorola, Inc., Schaumburg, Ill.

[21] Appl. No.: 794,026

[22] Filed: Nov. 1, 1985

[51] Int. Cl.⁴ .......................................... H03F 3/189
[52] U.S. Cl. .................................. 330/127; 330/202; 330/297; 455/89; 455/99; 455/127
[58] Field of Search ............... 330/127, 129, 133, 202, 330/279, 297; 455/89, 99, 55, 56, 127; 179/2 EB

[56] References Cited

U.S. PATENT DOCUMENTS

| | | | |
|---|---|---|---|
| 3,065,424 | 11/1962 | Whisenhunt | 325/319 |
| 4,307,455 | 12/1981 | Juhasz et al. | 364/900 |
| 4,414,623 | 11/1983 | Davis et al. | 364/200 |
| 4,455,623 | 6/1984 | Wesemeyer et al. | 364/900 |
| 4,510,460 | 4/1985 | Tamura | 330/297 |
| 4,523,155 | 6/1985 | Walczak et al. | 330/279 |

Primary Examiner—James B. Mullins
Attorney, Agent, or Firm—Rolland R. Hackbart

[57] ABSTRACT

Unique multi-level power amplifying circuitry is described that may be advantageously utilized in duplex portable radio transceivers which may be inserted into a vehicular adaptor for operation from the vehicle battery. Upon detecting the presence of the vehicular adaptor, the power amplifier may be operated at a second set of power levels which include levels greater than a first set of power levels for portable operation. The multi-level power amplifying circuitry of the present invention may be advantageously utilized in a variety of applications where duplex battery-operated radio transceivers may be inserted into a vehicular adaptor for operation from the vehicle battery.

28 Claims, 13 Drawing Figures

MULTI-LEVEL POWER AMPLIFYING CIRCUITRY FOR PORTABLE RADIO TRANSCEIVERS

BACKGROUND ART

The present invention is generally related to radio transceivers and more particularly related to an improved multi-level power amplifying circuitry for use in duplex battery-operated radio transceivers.

In the prior art, the maximum power output of power amplifiers in duplex battery-operated transceivers such as those used in portable radiotelephones was primarily dictated by the magnitude of the battery voltage and the need to conserve battery energy. Since vehicular operation was often desired in fringe areas, further away from the nearest fixed station than is typical in portable applications, there was a need for higher transmit power when such a portable radio transceiver is used in a vehicle. Furthermore, since the transmit and receive signals of such transceivers are duplexed, another power amplifier preceded by demultiplexing filters and followed by multiplexing filters and a separate power control circuit was required in order to boost the output power level by means of an external vehicle battery. This overall approach to boosting the output power level of such transceivers was costly and duplicative of transceiver filters, power amplifiers, and power control circuits.

OBJECTS AND SUMMARY OF THE INVENTION

Accordingly, it is an object of the present invention to provide improved and inexpensive power amplifying circuitry that is responsive to different supply voltages for providing different sets of output power levels.

It is another object of the present invention to provide improved multi-level power amplifying circuitry that detects the presence of a vehicular adaptor and switches from a first set of power levels to a second set of power levels.

Briefly described, the present invention encompasses power amplifying circuitry for amplifying a radio frequency (RF) signal from a radio transmitter and maintaining the magnitude of said amplified RF signal at one of a plurality of levels. The unique power amplifying circuitry further comprises: a power amplifier; means for applying to said power amplifier one of first and second supply voltages from first and second voltage sources, said second supply voltage having a magnitude greater than the magnitude of the first supply voltage; and means coupled to said applying means for selecting a first set of said plurality of levels when the first supply voltage is applied to said power amplifier and a second set of said plurality of levels when the second supply voltage is applied to said power amplifier, said second set of levels including levels of greater magnitude than said first set of levels.

DETAILED DESCRIPTION OF THE PREFERRED EMBODIMENT

Figure 1:
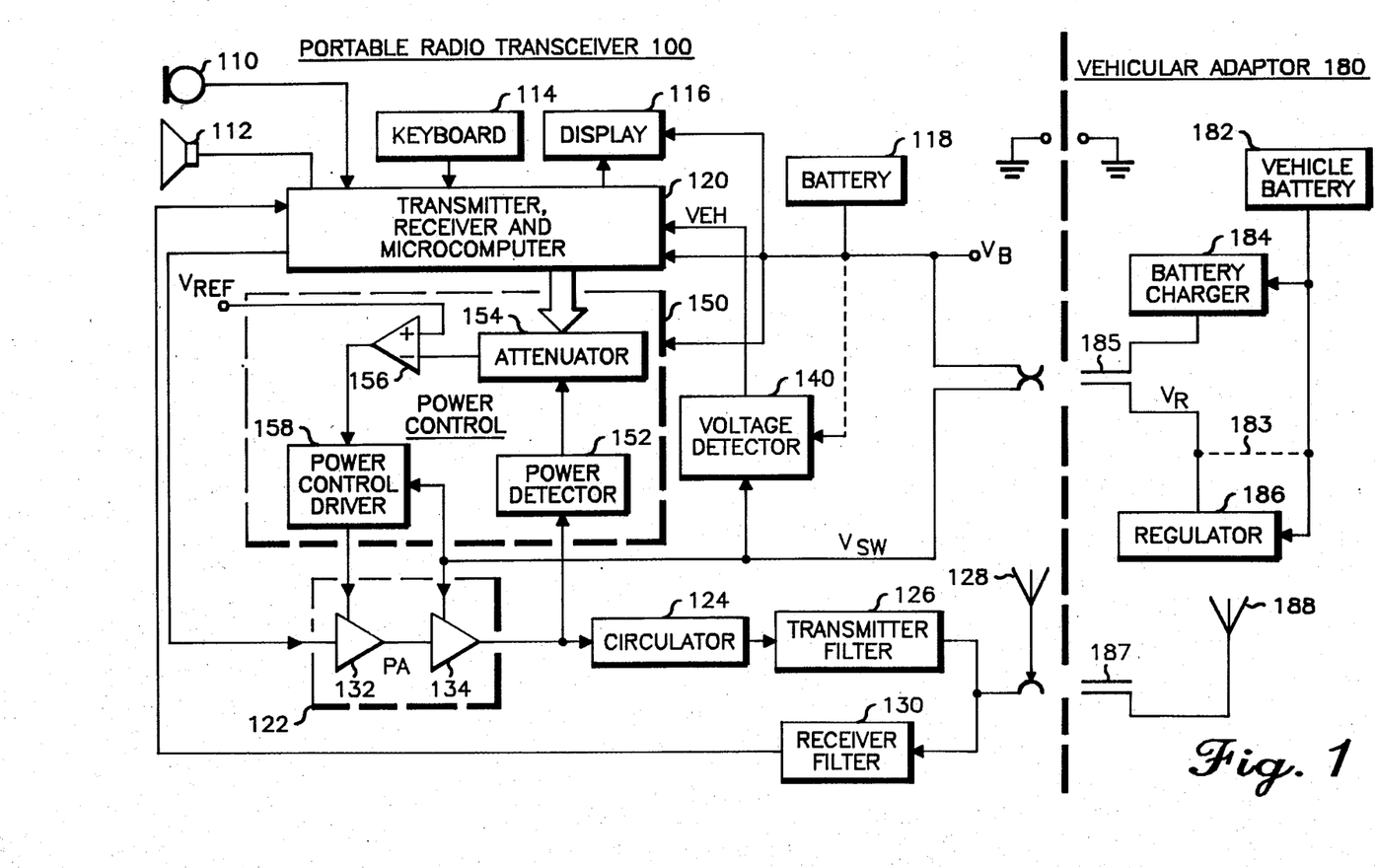
FIG. 1 is a block diagram of a portable radio transceiver embodying the present invention together with vehicular adaptor circuitry.

In FIG. 1, there is illustrated a portable radio transceiver 100 embodying the present invention together with a vehicular adaptor 180. Portable radio transceiver 100 includes a keyboard 114, display 116, microphone 110, speaker 112, battery 118, power control 150, voltage detector 140, power amplifier (PA) 122, circulator 124, transmitter filter 126, receiver filter 130, antenna 128 and transmitter, receiver and microcomputer 120. Vehicular adaptor 180 includes a vehicle battery 182, battery charger 184, voltage regulator 186 and antenna 188, all of which may be commercially available devices.

Figure 3:
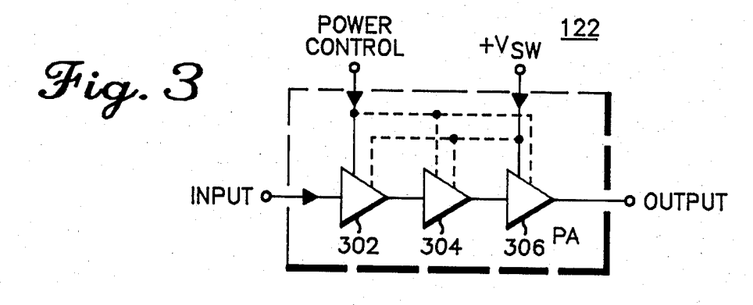
FIGS. 3, 4 and 5 are alternative embodiments of power amplifier stages for the power amplifier block in FIGS. 1, 6, 8, 10 and 12.
Figure 4:
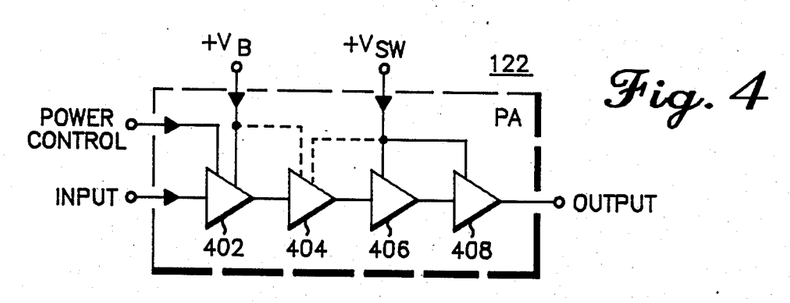
Figure 5:
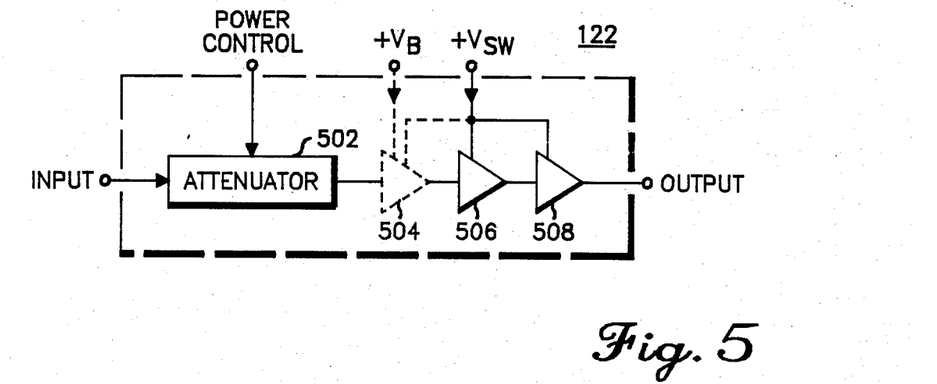

Referring to radio transceiver 100 in FIG. 1, power control 150 includes a power detector 152, attenuator 154 coupled by three binary control signals to microcomputer 120, differential amplifier 156 and power control driver 158, all of which may be implemented as shown and described in U.S. Pat. No. 4,523,155 (incorporated herein by reference thereto). Microcomputer 120 uses the three control signals applied to attenuator 154 to select one of eight different power levels of PA 122. The voltage Vref applied to differential amplifier 156 may be generated by a commercially available voltage regulator that is coupled to battery 118. PA 122 includes cascaded amplifier stages 132 and 134 and may also be arranged as illustrated in FIGS. 3, 4 and 5. PA 122 may be implemented with a commercially available device, such as, for example, a Motorola type MHW808 power amplifier. Likewise, circulator 124 and antenna 128 may be implemented with commercially available devices. Transmitter filter 126 and receiver filter 130 may be implemented as shown and described in U.S. Pat. No. 4,431,977 (incorporated herein by reference thereto). Voltage detector 140 may be a conventional analog-to-digital converter (such as a Motorola type MC14442 converter) whose digitized output corresponds to the magnitude of Vsw, or may be a conventional comparator whose output changes from a low to a high state when VSW exceeds Vb by a predetermined amount. Transmitter, receiver and microcomputer 120 and associated blocks 110, 112, 114 and 116 may also be implemented by corresponding conventional circuitry shown and described in Motorola Instruction Manual no. 68P81046E60, entitled "DYNATAC Cellular Portable Telephone", or in U.S. Pat. No. 4,486,624. This and other Motorola Instruction Manuals may be obtained from the Service Publications Department of Motorola, Inc., 1301 East Algonquin Road, Schaumburg, Ill. 60196, or from Motorola C & E Parts, 1313 East Algonquin Road, Schaumburg, Ill. 60196.

Referring to vehicular adaptor 180 in FIG. 1, voltage regulator 186 is optional and may be bypassed as shown by dotted line 183. Voltage regulator 186 both protects and optimizes the efficiency of PA 122. For example, voltage regulator 186 protects PA 122 from damage due to over-voltage conditions arising during charging of vehicle battery 182 or "jump starting" of the vehicle. Voltage regulator 186 also optimizes the efficiency of PA 122 by maintaining Vr, and hence Vsw, at a voltage just large enough to enable PA 122 to reach the highest power level at which it is intended to operate. However, such highest power level may also be attained by bypassing voltage regulator 186 as shown by dotted line 183 without departing from the true spirit and scope of the present invention.

When portable radio transceiver 100 in FIG. 1 is coupled by plug or otherwise to vehicular adaptor 180, plugs 185 and 187 insert into corresponding receptacles for coupling battery 118 to battery charger 184, Vsw to Vr from voltage regulator 186 (or directly from vehicle battery 182 as shown by dotted line 183) instead of battery 118, and antenna 188 to transmitter filter 126 and receiver filter 130 instead of antenna 128. As a result, power control driver 158 and PA 122 are now powered from vehicle battery 182 through voltage regulator 186 which provides a voltage Vr having a magnitude greater than the magnitude of the voltage Vb provided by battery 118. For example, regulator 186 may provide an 11 V voltage, while battery 118 may provide a 6 V voltage.

Microcomputer 120 in FIG. 1 senses the presence of adaptor 180 by monitoring the VEH signal from voltage detector 140. If voltage detector 140 is implemented with a commercially available comparator (e.g., a Motorola type MC1710 comparator), the VEH signal changes state when Vsw exceeds Vb by a predetermined amount. The change in state of the VEH signal informs microcomputer 120 that adaptor 180 is present. Alternatively, if voltage detector 140 is implemented with a commercially available analog-to-digital converter (e.g., a Motorola type MC14442), the VEH signal is the digital representation of the magnitude of the Vsw voltage and, for example, changes from a representation of 6 V to 11 V. Microcomputer 120 compares the digital value of the VEH signal to the previous value or stored predetermined values to determine that adaptor 180 is present (see also description below for block 204 in FIG. 8).

Microcomputer 120 in FIG. 1 periodically monitors the VEH signal to determine when adaptor 180 is present. According to an important feature of the present invention, microcomputer 120 changes the operational class of transceiver 100 when adaptor 180 is present. The operational class is changed, for example, from class 3 to class 1 when adaptor 180 is present, and vice versa. In operational class 3, power control driver 158 and PA 122 are powered by battery 118 and produces a first set of power levels for PA 122. In the preferred embodiment, the first set of power levels includes six power levels. When switching to operational class 1, a second set of power levels for PA 122 is produced. In the preferred embodiment, the second set of power levels includes eight power levels, two more power levels higher in magnitude than those in the first set. Additional higher power levels may be produced in operational class 1 since the voltage Vr from regulator 186 has a magnitude greater than that of the voltage from battery 118. Furthermore, the exact value of power levels 1-6 may also change from Class 1 to Class 3 in order to compensate for changes in gain between antennas 188 and 128.

Figure 2:
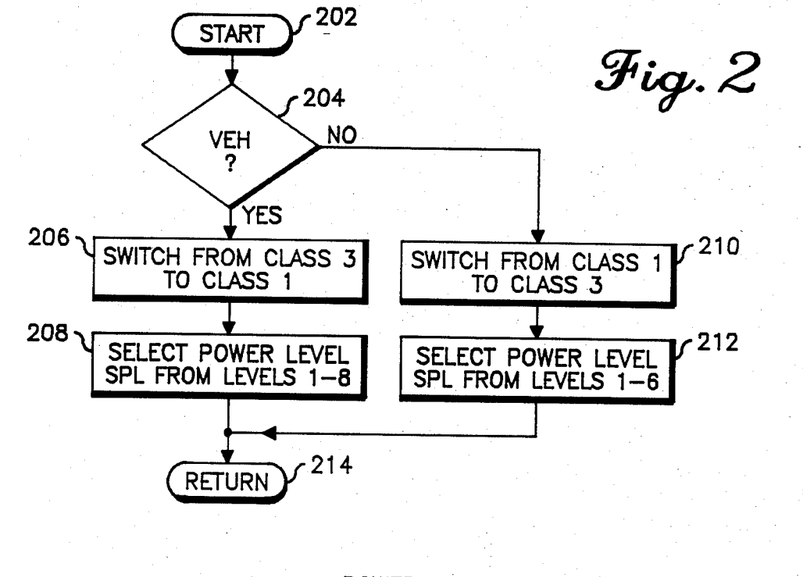
FIG. 2 is a flow chart for the process used by the portable radio transceiver in FIG. 1 for power level selection.

The foregoing operation of microcomputer 120 in FIG. 1 is illustrated in more detail by the flow chart in FIG. 2. The following description assumes that voltage detector 140 is a comparator. The flow chart is entered at START block 202 and proceeds to decision block 204 where a check is made of the VEH signal. IF the VEH signal has a first state (e.g., binary one) indicating that the adaptor 180 is present, YES branch is taken to block 206. In block 206, the operational class of transceiver 100 is changed from class 3 to class 1. Next, at block 208, a power level SPL is selected from the second set of eight levels, attenuator 154 is set to produce SPL, and microcomputer 120 returns to other tasks at block 214. In cellular radiotelephone systems, portable and mobile transceivers change power levels in response to commands transmitted from the radiotelephone central control terminal via base station radios (see U.S. Pat. No. 4,485,486). Returning to decision block 204, if the VEH signal has a second state (e.g., binary zero) indicating that the adaptor 180 is not present, NO branch is taken to block 210. In block 210, the operational class of transceiver 100 is changed from class 1 to class 3. Next, at block 212, a power level SPL is selected from the first set of six levels, attenuator 154 is set to produce SPL, and microcomputer 120 returns to other tasks at block 214.

The flow charts in FIGS. 2, 7, 9, 11 and 13 provide a detailed description of the process steps to be executed by microcomputer 120. The coding of the process steps in these flow charts into instructions of a suitable commercially available microcomputer is a mere mechanical step for a routineer skilled in the programming art.

According to another feature of the present invention, the various stages in PA 122 may be operated at a plurality of supply voltages for the purposes of setting its output power at a selected power level in the first or second sets of power levels and enabling PA 122 to reach higher power levels when transceiver 100 is coupled to vehicular adaptor 180. In the preferred embodiment, connecting different voltage sources to Vsw for supplying DC power to the final stage 134 of PA 122 allows the attainment of higher power levels in the second set than those in the first set of power levels. Also, in the preferred embodiment, power control driver 158 varies the supply voltage to stage 132 in order to maintain the output of PA 122 at the level selected by microcomputer 120. Since power control driver 158 is also coupled to voltage Vsw, higher levels of DC voltage may also be applied to driver stage 132 for achieving the higher power levels in the second set of power levels.

Alternative implementations of PA 122 are shown in FIGS. 3, 4 and 5. These implementations are shown to indicate a variety of possible configurations achievable with commercially available power amplifying circuitry. In FIG. 3, PA 122 is shown with two or more stages 302, 304 and 306, where DC voltage may be applied to the various stages by connection to Vsw or the power control signal. The connections of stages 302, 304 and 306 to Vsw and the power control signal may be configured to optimize PA performance characteristics, such as, efficiency, stability, continuity of power variation, and other requirements due to a particular application.

In FIG. 4, another alternative embodiment for PA 122 is shown where the power control signal is coupled to the DC biasing point of the first stage 402. The DC biasing point of one or more stages may be coupled to the power control signal in order to obtain improved stability and/or power output controllability. This arrangement is common practice when FET devices or forward-biased bipolar devices are used as the active device in a PA stage. Since it is not necessary to raise the DC supply voltage on all PA stages in order to obtain increased power output, stages 402 and 404 may be coupled to voltage Vb from battery 118.

In FIG. 5, yet another alternative embodiment of PA 122 is shown where the power control signal is coupled to an electronically variable attenuator 502 which varies the RF input drive power to one or more amplifier stages 504, 506 and 508. Attenuator 502 may be one or more PIN diodes with variable bias or a resistor network with variable resistance. Combinations of the various features found in FIGS. 3, 4 and 5 may also be employed as needed to provide proper functioning of the circuit chosen for PA 122. The key feature common to all approaches, that makes the higher power levels possible, is the raising of supply voltages to selected PA stages and/or the power control driver when adaptor 180 is connected.

Figure 6:
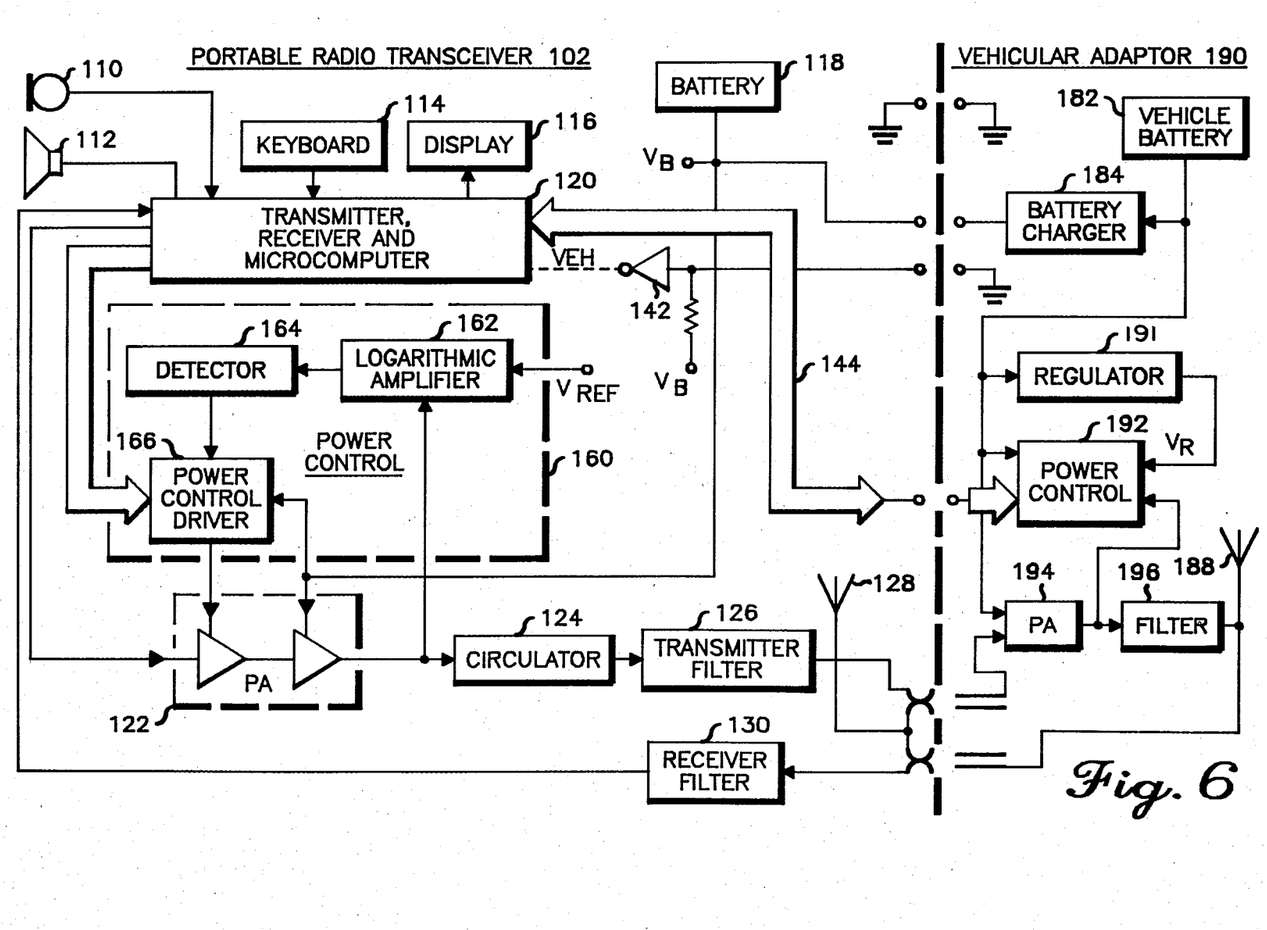
FIG. 6 is another block diagram of a portable radio transceiver embodying the present invention together with vehicular adaptor circuitry.

Turning to FIG. 6, there is illustrated another portable radio transceiver 102 embodying the present invention together with another vehicular adaptor 190. Transceiver 102 is substantially the same as transceiver 100 in FIG. 1 with the exception of power control 160, inverting gate 142 and data bus 144. Power control 160 includes a logarithmic amplifier 162, detector 164 and power control driver 166, all of which may be implemented as shown and described in U.S. patent application Ser. No. 729,016, filed Apr. 30, 1985, entitled "Automatic Output Control Circuitry for RF Power Amplifiers with Wide Dynamic Range," invented by Richard J. Vilmur and assigned to Motorola, Inc. (incorporated herein by reference thereto). Data bus 144 includes three control signals coupled to adaptor 190 for selecting one of eight power levels of PA 194. Inverting gate 142 is coupled to adaptor 190 for generating the VEH signal.

Adaptor 190 is similar to adaptor 180 in FIG. 1 with the exception of power control 192, PA 194, regulator 191 and filter 196. Power control 192 may be implemented the same as power control 150 in FIG. 1 or power control 160 in FIG. 6. Voltage regulator 191 generates a reference voltage Vr for application to power control 192 and may be implemented with a commercially available device. PA 194 may be implemented in a similar manner to PA 122 in FIGS. 1, 3, 4 and 5. Filter 196 may be implemented the same as transmitter filter 126.

When transceiver 102 is coupled by plug or otherwise to adaptor 190, battery charger 184 is coupled to battery 118, the input of inverting gate 142 is grounded, data bus 144 is coupled to power control 192, transmitter filter 126 is coupled to PA 194 instead of antenna 128, and receiver filter 130 is coupled to antenna 188 instead of antenna 128. When plugged into adaptor 190, the output of PA 122 is set to a predetermined level, and PA 194 and power control 192 produce the desired power levels for application to filter 196 and antenna 188. Data bus 144 is used by microcomputer 120 to apply three power control signals to power control 192 for selecting the desired power level of PA 194. The power control signals of data bus 144 may be three binary signals for selecting one of eight levels as shown and described in U.S. Pat. No. 4,523,155.

Data bus 144 in FIG. 6 may also include bidirectional serial data lines, such as, for example, those shown and described in U.S. Pat. Nos. 4,369,516 and 4,486,624. Data lines in data bus 144 may be used to carry messages between microcomputer 120 and another microcomputer in power control 192, which may be arranged similar to microcomputer 120 in FIGS. 1, 6 and 8 for controlling power control 196. Such messages may convey power level and status information between the two microcomputers. For example, microcomputer 120 may periodically poll the microcomputer in power control 192 to determine when adaptor 190 is present and the current power level of PA 194.

Vehicular adaptor 190 in FIG. 6 boosts the power level of PA 122 by means of PA 194 which is coupled to a higher voltage from vehicle battery 182. Microcomputer 120 monitors VEH or data bus 144 to determine when adaptor 190 is present. The VEH signal from inverting gate 142 has a binary one state when adaptor 190 is present and a binary zero state when adaptor 190 is not present. As described hereinabove, microcomputer 120 may also poll a microcomputer in power control 192 to determine when adaptor 190 is present. Upon determining that adaptor 190 is present, microcomputer 120 sets the power level of PA 122 to a predetermined level, such as, for example, a power level of the first set of power levels that will provide a signal of 11 dBm at the output of transmitter filter 126. Power control 192 is responsive to the power control signals from bus 144 for maintaining the output of PA 194 at the selected one of the second set of power levels, which, in the preferred embodiment, includes eight power levels.

Figure 7:
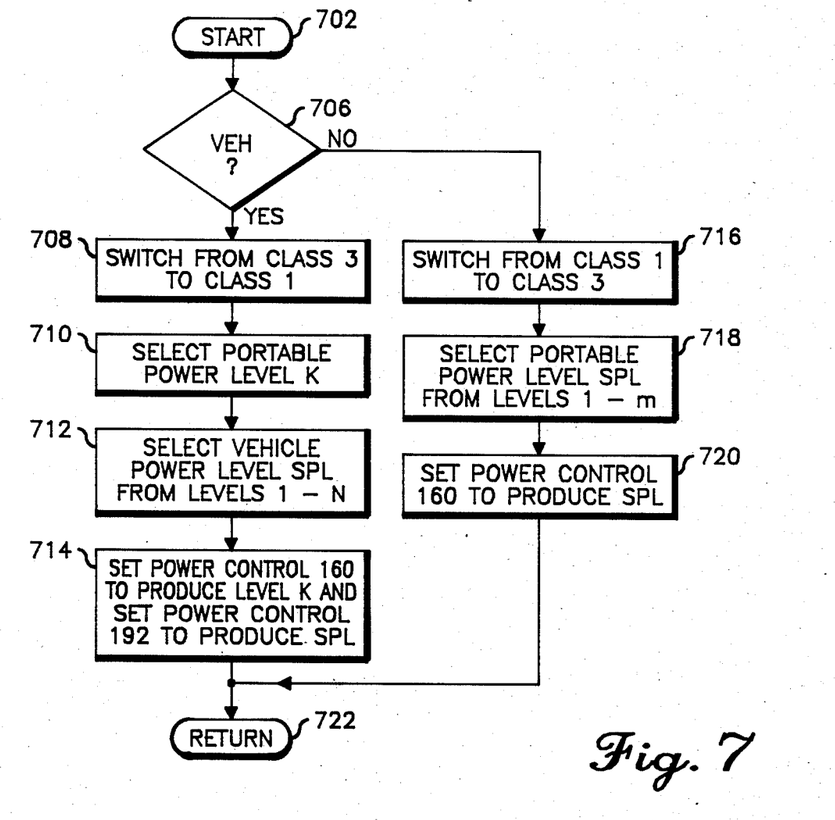
FIG. 7 is a flow chart for the process used by the portable radio transceiver in FIG. 6 for power level selection.

The foregoing operation of microcomputer 120 in FIG. 6 is illustrated in more detail by the flow chart in FIG. 7. The flow chart is entered at START block 702 and proceeds to decision block 706 where a check is made of the VEH signal. IF the VEH signal has a first state (e.g., binary one) indicating that the adaptor 190 is present, YES branch is taken to block 708. In block 708, the operational class of transceiver 102 is changed from class 3 to class 1. Next, at block 710, a power level K is selected from the first set of M levels using power control 160. The power level K may be selected to produce a desired power level at the output of transmitter filter 126 in FIG. 6. Then at block 712, a power level SPL is selected from the second set of N levels using power control 192. Next, at block 714, power control 160 is set to produce level K and power control 192 is set to produce SPL, and microcomputer 120 returns to other tasks at block 722. As previously explained, the second set of N levels includes at least one power level that has a magnitude greater than that of the highest power level in the first set of M levels.

Returning to decision block 706 in FIG. 7, if the VEH signal has a second state (e.g., binary zero) indicating that adaptor 190 is not present, NO branch is taken to block 716. In block 716, the operational class of transceiver 102 is changed from class 1 to class 3. Then, at block 718, a power level SPL is selected from the first set of M levels. Next, at block 720, power control 160 is set to produce SPL, and microcomputer 120 returns to other tasks at block 722. The number of power levels M in the first set and N in the second set may be selected to produce the desired number of power steps in a particular application.

Figure 8:
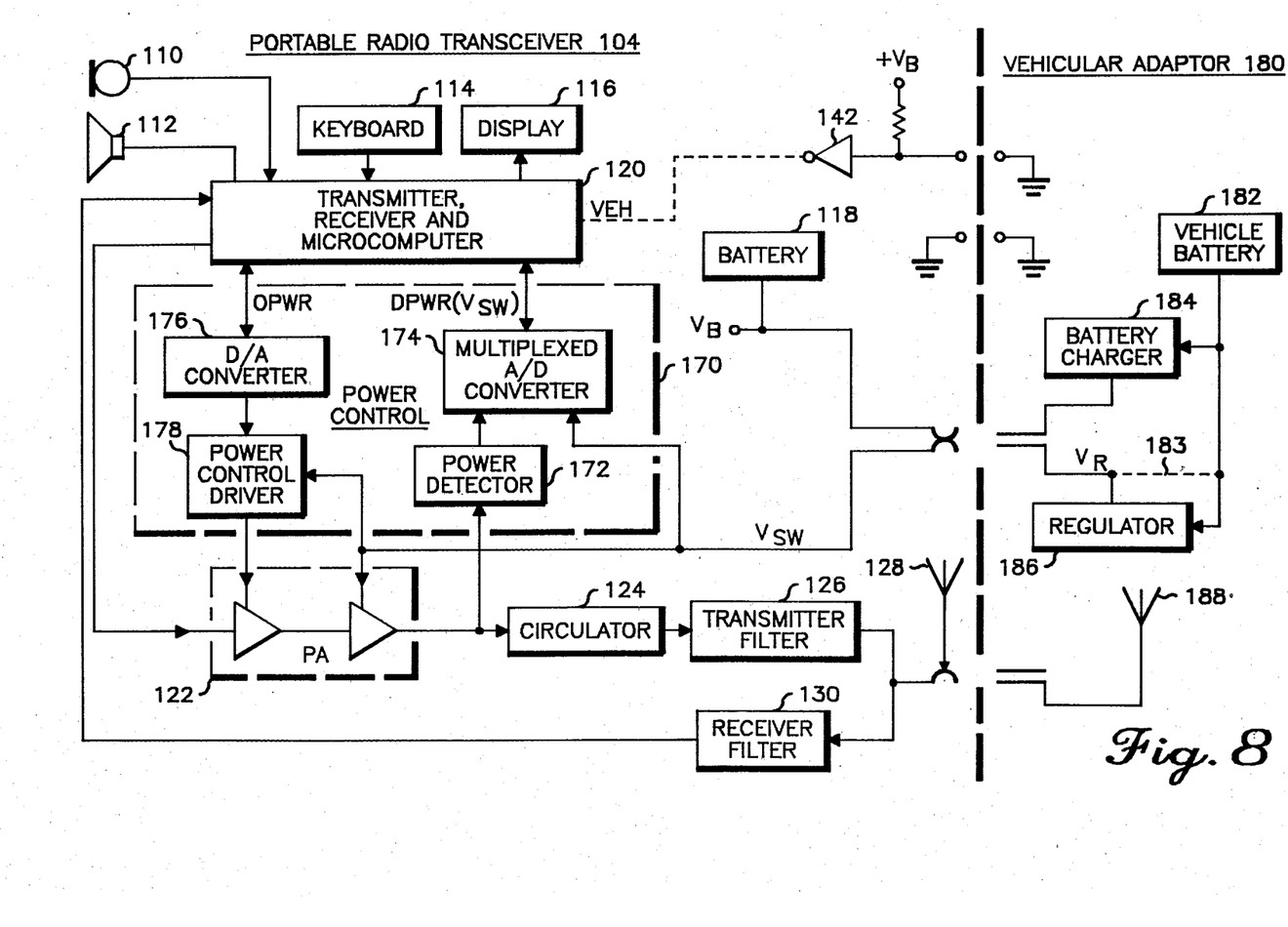
FIG. 8 is yet another block diagram of a portable radio transceiver embodying the present invention together with vehicular adaptor circuitry.

Referring next to to FIG. 8, there is illustrated another portable radio transceiver 104 embodying the present invention together with vehicular adaptor 180. Transceiver 104 is substantially the same as transceiver 100 in FIG. 1 with the exception of power control 170 and inverting gate 142. Power control 170 includes a power detector 172, a multiplexed analog-to-digital (A/D) converter 174, a digital-to-analog (D/A) converter 176 and power control driver 178. Power detector 172 and power control driver 178 may be implemented as shown and described in U.S. Pat. No. 4,523,155. Converters 174 and 176 may be any suitable commercially available converters, such as, for example, Motorola type MC14442 and MC144111 converters, respectively. Inverting gate 142 is coupled to adaptor 180 for generating the VEH signal.

Microcomputer 120 in FIG. 8 monitors VEH or utilizes converter 174 to determine when adaptor 180 is present. The VEH signal from inverting gate 142 has a binary one state when adaptor 180 is present and a binary zero state when adaptor 180 is not present. If VEH is monitored, microcomputer 120 periodically executes the flow chart in FIG. 2.

According to another feature of the present invention, microcomputer 120 in FIG. 8 may utilize converter 174 to convert Vsw to a digital representation which is compared to stored predetermined numbers to determine if adaptor 180 is present. Converter 174 periodically monitors either DPWR or Vsw in response to a select signal from microcomputer 120. In the case of Vsw, digital representations of Vb and Vr may be stored by microcomputer 120 to determine when adaptor 180 is present. The flow chart in FIG. 2 may be used for this purpose by changing decision block 204 to read: "Determine whether the digital representation of Vsw is greater than a digital representation of a voltage between that of Vb and Vr, such as, for example (Vb+Vr)/2". Therefore, to monitor Vsw, microcomputer 120 periodically executes the flow chart in FIG. 2, and in order to maintain the selected power level, SPL, microcomputer 120 periodically executes the flow chart in FIG. 9.

Figure 9:
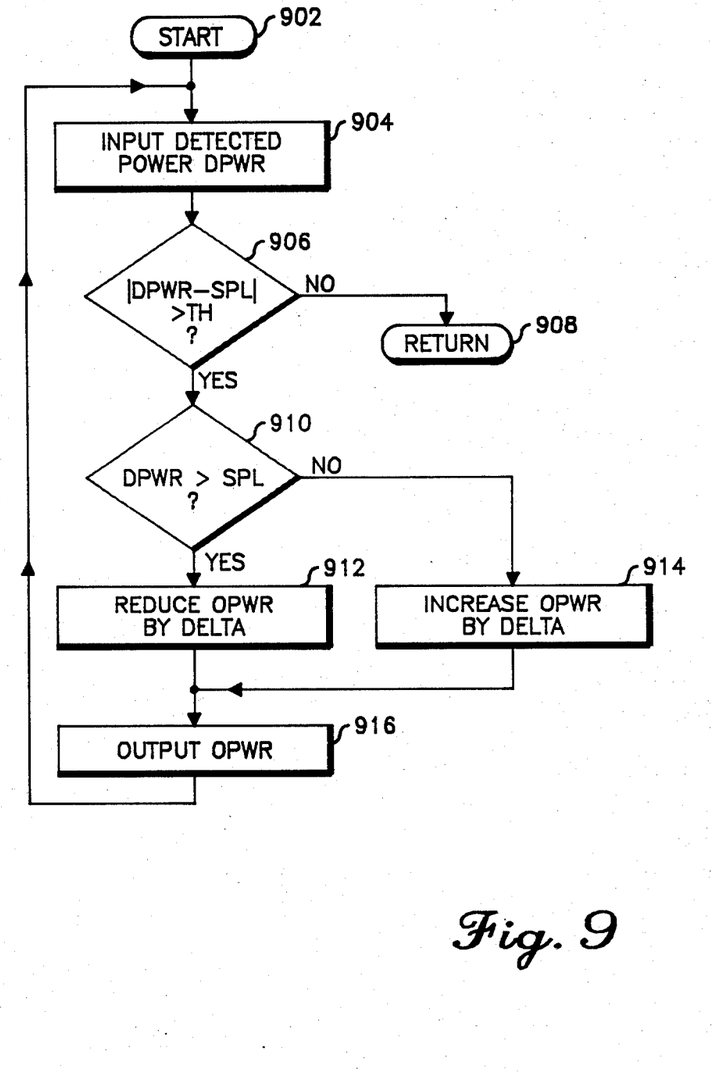
FIG. 9 is a flow chart for the process used by the portable radio transceiver in FIG. 8 to control the circuitry in the power control block thereof.

The foregoing operation of microcomputer 120 in FIG. 8 is illustrated in more detail by the flow chart in FIG. 9. The flow chart is entered at START block 902 and proceeds to block 904 where DPWR is input from converter 174. DPWR is the digital representation of the output of detector 172. Next, at decision block 904, a check is made to see if the absolute value of DPWR-SPL is greater than TH, where SPL is a digital representation of the selected power level and TH is a predetermined number. TH represents a minimum difference that must exist between DPWR and SPL before a correction is made in OPWR. OPWR is the digital representation of the analog control signal that, when coupled to the power control driver 178, is used to make fine adjustments in the output of PA 122. If the absolute value of DPWR-SPL is less than TH, NO branch is taken to return to other tasks at block 908. Returning to decision block 906, if the absolute value of DPWR-SPL is greater than TH, YES branch is taken to decision block 910. In decision block 910, a check is made to see if DPWR is greater than SPL. If so, YES branch is taken to block 912 to reduce OPWR by DELTA. DELTA is a predetermined step size chosen to be small enough so that the resulting steps in DPWR are always less than TH. Otherwise, NO branch is taken from decision block 910 to block 914 where OPWR is increased by DELTA. Next, at block 916, OPWR is output to converter 176 and microcomputer 120 returns to block 904 to repeat the process steps of the flow chart until the absolute value of DPWR-SPL is less than TH, whereupon microcomputer 120 returns to other tasks at block 908.

Figure 10:
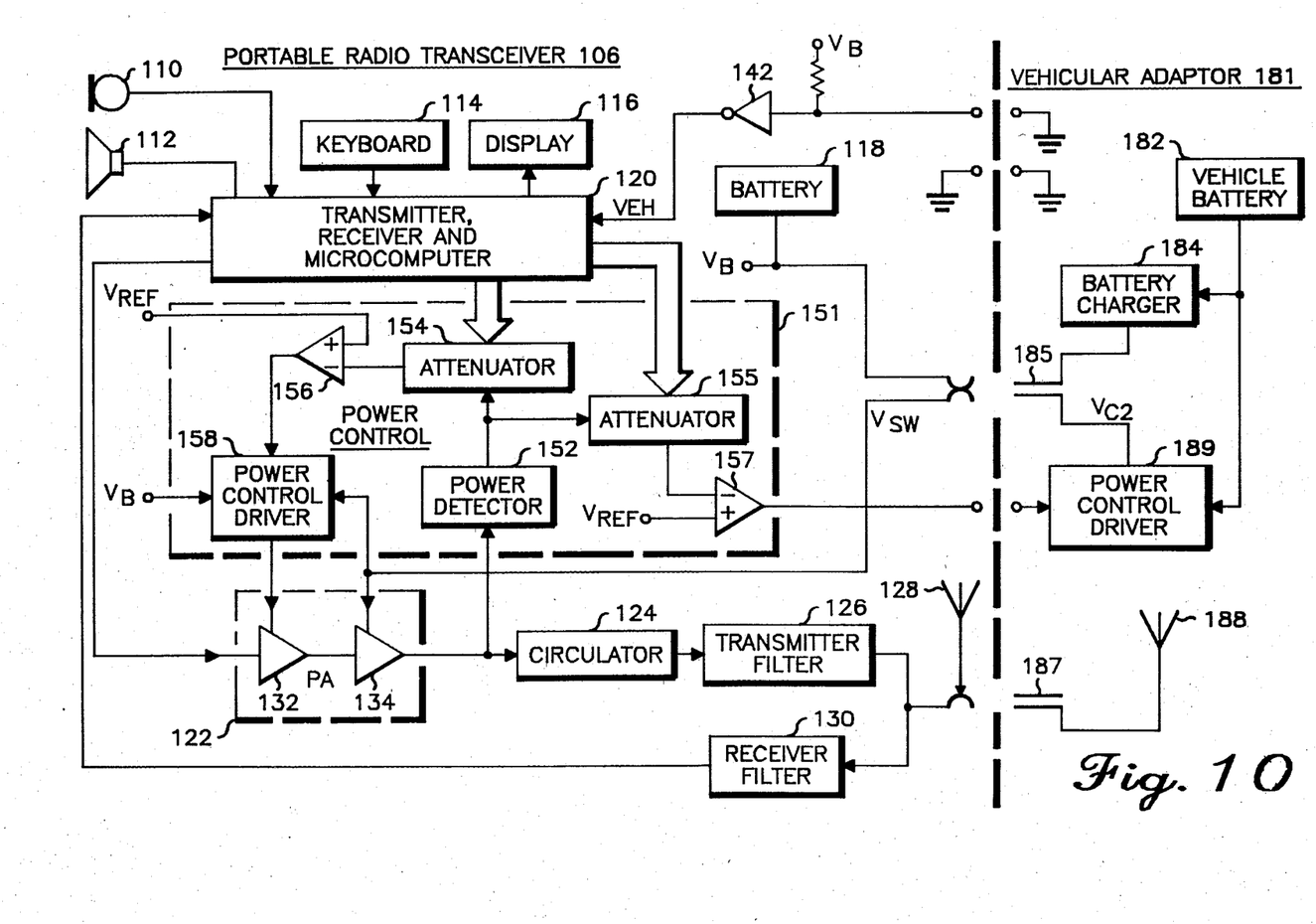
FIG. 10 is yet another block diagram of a portable radio transceiver embodying the present invention together with vehicular adaptor circuitry.

Referring next to FIG. 10, there is illustrated another portable radio transceiver 106 embodying the present invention together with another vehicular adaptor 181. Transceiver 106 is substantially the same as transceiver 100 in FIG. 1 with the exception of power control 151, inverting gate 142. Power control 151 contains an additional control path consisting of attenuator 155 and differential amplifier 157, which is, in turn, connected to a power control driver 189 in vehicular adaptor 181. Inverting gate 142 is coupled to adaptor 181 for generating the VEH signal. Adaptor 181 is similar to adaptor 180 with the exception of power control driver 189 which replaces voltage regulator 186. Power control driver 189 may be implemented in the same manner as power control driver 158 and may alternatively be located in power control 151, in which case vehicle battery 182 is coupled to plug 185.

When transceiver 106 in FIG. 10 is coupled by plug or otherwise to adaptor 181, battery charger 184 is coupled to battery 118, filters 120 and 130 are connected to antenna 188 instead of antenna 128, the input of inverting gate 142 is grounded, the input of power control driver 189 is connected to the output of differential amplifier 157, and Vsw is coupled to Vc2 instead of Vb. Vehicular adaptor 181 boosts the maximum power level of PA 122 by supplying one or more stages in PA 122 with voltge Vc2 whose magnitude may exceed the magnitude of the voltage supplied by battery 118. This is made possible by the fact that power control driver 189 is coupled to vehicle battery 182, which has a voltage of greater magnitude than that of voltage Vb from battery 118.

Microcomputer 120 in FIG. 10 periodically monitors the VEH signal from inverting gate 142 to determine when adaptor 181 is present. Switching between operational class 3 and class 1 and selection of the appropriate power level SPL from the first or second set of power levels occurs in a similar manner to that shown and described herein with respect to FIG. 2. When transceiver 106 is detached from adaptor 181, the selection of operational class 3 and a power level SPL from the first set of power levels is the same as that shown in FIG. 2. However, when transceiver 106 is coupled to adaptor 181, maintaining a selected power level in the second set of power levels is dependent upon whether or not the magnitude of the selected power level exceeds the magnitude of the maximum power level in the first set of power levels. In this case, voltage Vc2 is coupled to stage 134 for attaining and maintaining such selected power level in the second set of power levels.

Figure 11:
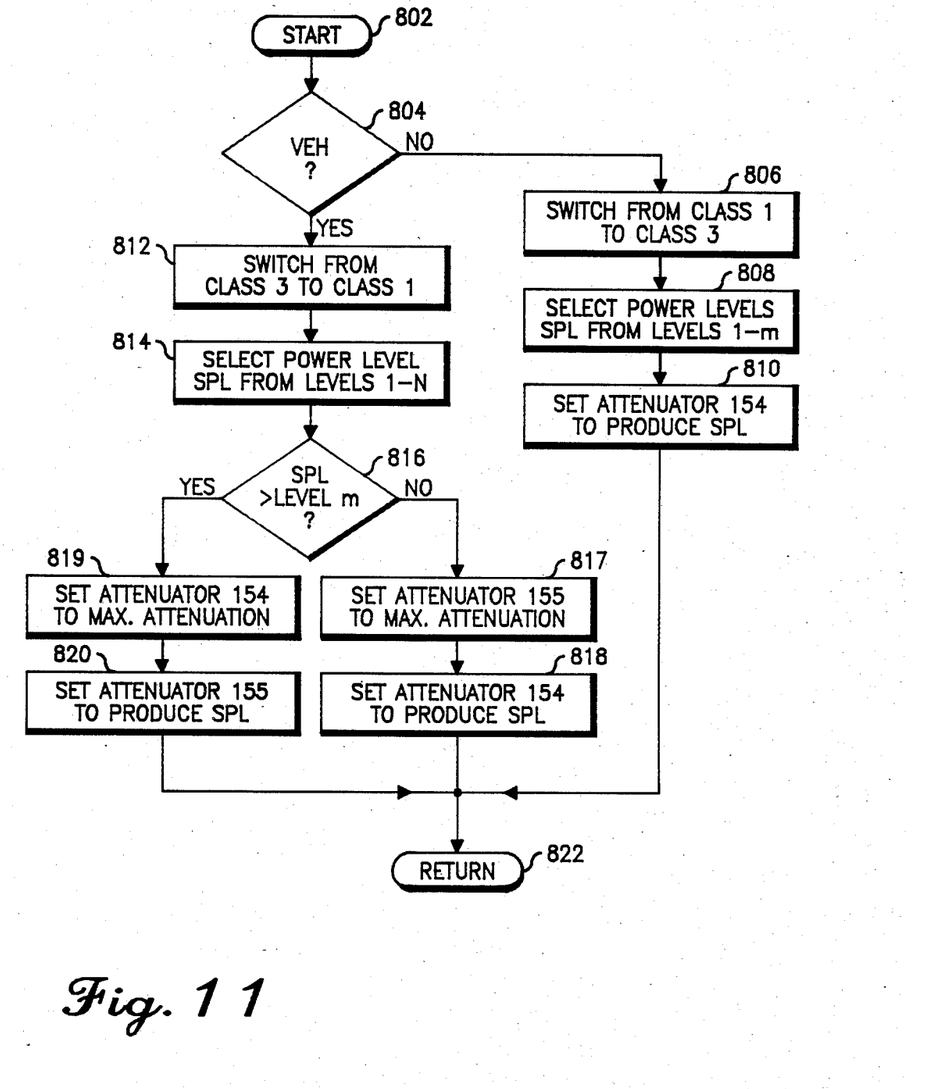
FIG. 11 is a flow chart for the process used by the portable radio transceiver in FIG. 10 for power level selection.

The foregoing operation of microcomputer 120 in FIG. 10 is illustrated in more detail by the flow chart in FIG. 11. The flow chart is entered at START block 802 and proceeds to decision block 804 where a check is made of the VEH signal. If the VEH signal has a first state (e.g., binary zero) indicating that adaptor 181 is not present, NO branch is taken to block 806. In block 806, the operational class of transceiver 106 is changed from class 1 to class 3. Next, at block 808, a power level SPL is selected from among the first set of M levels as commanded by the central control terminal. The power levels in the first set of M levels are preferably arranged in increasing order of magnitude such that level M has the highest magnitude. Next, at block 810 attenuator 154 is set to the value needed by power control 151 to maintain the selected power level SPL, and microcomputer 120 returns to other tasks at block 822.

Returning to decision block 804 in FIG. 11, if the VEH signal has a second state (e.g., binary one) indicating that adaptor 181 is present, YES branch is taken to block 812. In block 812, the operational class is changed from class 3 to class 1. Next, at block 814, a power level SPL is selected from among the second set of N power levels as commanded by the central control terminal. The number N of power levels in the second set is greater than the number M of power levels in the first set. Furthermore, the second set includes one or more power levels having a magnitude greater than that of level M, the highest power level in the first set. Next, at decision block 816, the magnitude of the selected power level SPL is compared to the magnitude of level M. If the magnitude of SPL is greater than the magnitude of level M, YES branch is taken to block 819. In block 819, attenuator 154 is set to its maximum attenuation, which is chosen to be great enough to keep the output from attenuator 154 below the magnitude of Vref for all possible output levels from PA 122. As a result, power control driver 158 produces a maximum output voltage (which typically is slightly below the magnitude of voltage Vb from battery 118). Next, at block 820, attenuator 155 is set to the value necessary to maintain the selected power SPL using power control driver 189, and microcomputer 120 returns to other tasks at block 822.

Returning to decision block 816 in FIG. 11, if the magnitude of SPL is not greater than the magnitude of level M, NO branch is taken to block 817. In block 817, attenuator 155 is set to its maximum attenuation, which is chosen to be great enough to keep the output from attenuator 155 below the magnitude of Vref for all possible output levels from PA 122. As a result, power control driver 189 produces a maximum output voltage Vc2 which typically has a magnitude that is slightly less than the magnitude of the voltage from vehicle battery 182. Next, at block 818, attenuator 154 is set to the value necessary to maintain the selected power level SPL using power control driver 158, and microcomputer 120 returns to other tasks at block 822.

Figure 12:
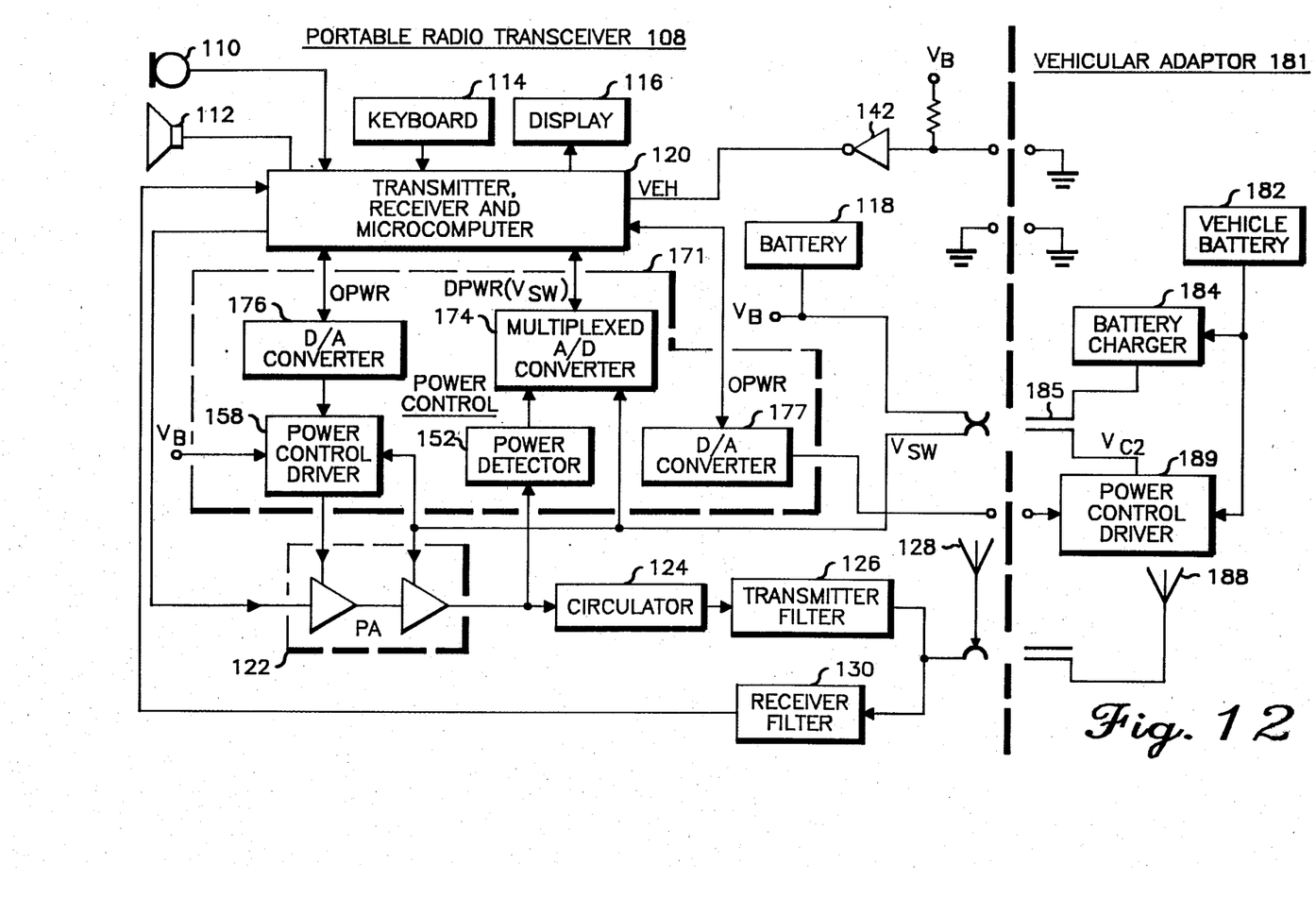
FIG. 12 is yet another block diagram of a portable radio transceiver embodying the present invention together with vehicular adaptor circuitry.

Referring next to FIG. 12, there is illustrated another portable radio transceiver 108 embodying the present invention together with vehicular adaptor 181. Transceiver 108 is substantially the same as transceiver 106 in FIG. 10 with the exception of power control 171. Power control 171 contains multiplexed A/D converter 174 instead of attenuators 154 and 155, and D/A converters 176 and 177 instead of differential amplifiers 156 and 157.

Figure 13:
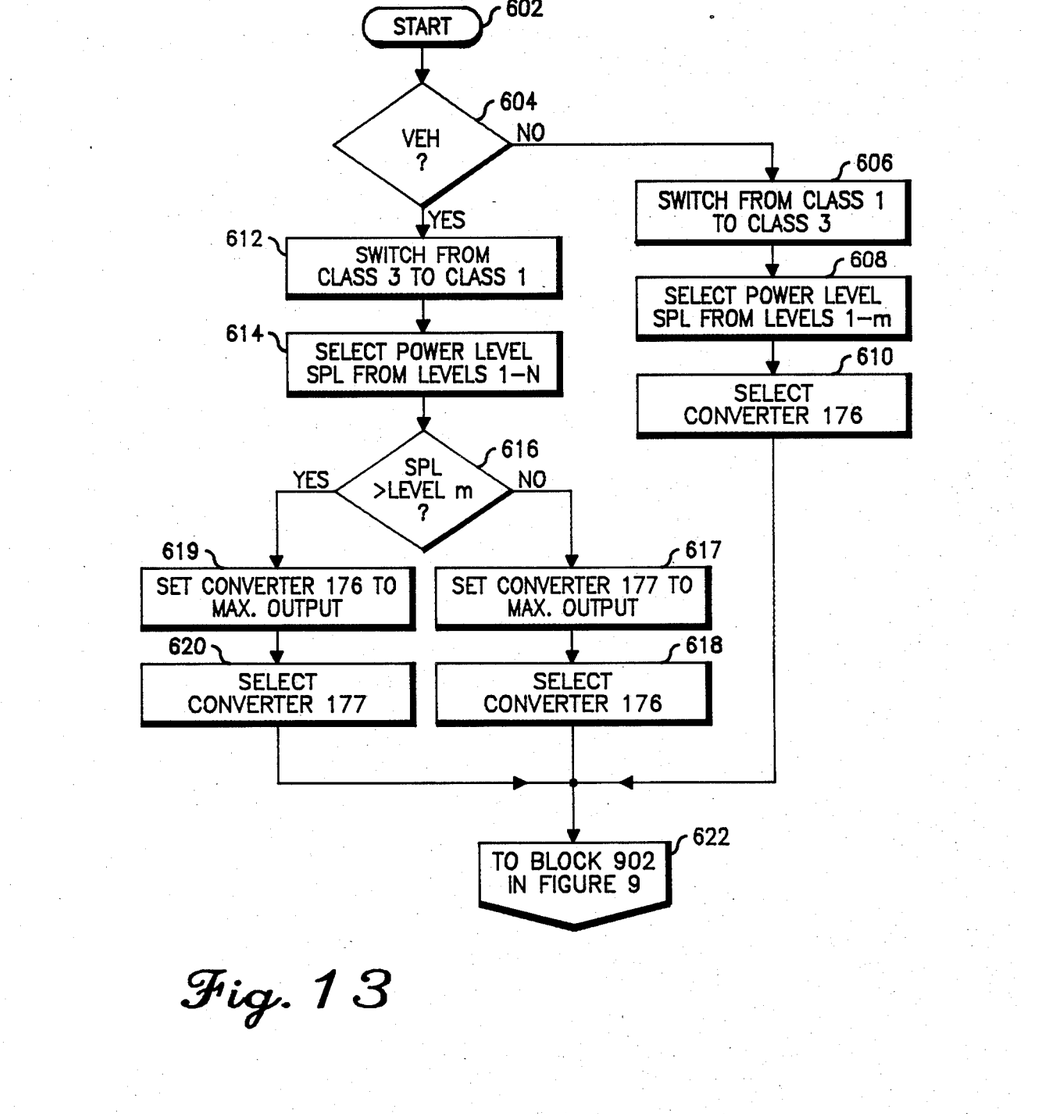
FIG. 13 is a flow chart for the process used by the portable radio transceiver in FIG. 12 for power level selection.

The operation of microcomputer 120 in FIG. 12 is illustrated in more detail by the flow charts in FIGS. 13 and 9. The flow chart in FIG. 13 is substantially identical to the flow chart in FIG. 11. The flow chart is entered at START block 602 and proceeds to decision block 604 where a check is made of the VEH signal. If the VEH signal has a first state (e.g., binary zero) indicating that adaptor 181 is not present, NO branch is taken to block 606. In block 606, the operational class of transceiver 108 is changed from class 1 to class 3. Next, at block 608, a power level selected from among the first set of M levels as commanded by the central control terminal. The magnitude of levels 1–M is arranged in increasing order with level M having the highest magnitude. Next, at block 610, converter 176 is selected, and microcomputer 120 exits at block 622 to block 902 in FIG. 9, where the output of converter 176 is adjusted to the value needed to maintain the selected power level SPL.

Returning to decision block 604 in FIG. 13, if the VEH signal has a second state (e.g., binary one) indicating that adaptor 181 is present, YES branch is taken to block 612. In block 612, the operational class is changed from class 3 to class 1. Next, at block 614, a power level SPL is selected from among the second set of N power levels as commanded by the central control terminal. The second set of N levels includes at least one level with a magnitude greater than that of level M. Next, at decision block 616, the magnitude of the selected power level SPL is compared to the magnitude of level M. If the magnitude of SPL is greater than the magnitude of level M, YES branch is taken to block 619. In block 619, converter 176 is set to its maximum output. As a result, power control driver 158 produces a maximum output voltage (which typically is slightly below the magnitude of voltage Vb from battery 118). Next, at block 620, converter 177 is selected, and microcomputer 120 exits at block 622 to block 902 in FIG. 9, where the output of converter 177 is adjusted to the value needed to maintain the selected power level SPL.

Returning to decision block 616 in FIG. 13, if the magnitude of SPL is not greater than the magnitude of level M, NO branch is taken to block 617. In block 617, converter 177 is set to its maximum output. As a result, power control driver 189 produces a maximum output voltage Vc2 (which typically is slightly below the magnitude of the voltage from vehicle battery 182). An alternative implementation of block 617 is to set converter 177 such that power control driver 189 produces an output voltage substantially equal in magnitude to that produced by battery 118. Next, at block 618, converter 176 is selected, and microcomputer 120 exits at block 622 to block 902 in FIG. 9, where the output of converter 176 is adjusted to the value needed to maintain the selected power level SPL.

In summary, unique multi-level power amplifying circuitry has been described that may be advantageously utilized in portable radio transceivers which are insertable into a vehicular adaptor for operation from the vehicle battery. Upon detecting the presence of the vehicular adaptor, the power amplifier may be operated at a second set of power levels which include levels greater than those in a first set of power levels for portable operation. The multi-level power amplifying circuitry of the present invention may be advantageously utilized in a variety of applications where battery-operated radio transceivers may be inserted into an adaptor for operation from another power source.

I claim:

1. Power amplifying circuitry for a radio frequency (RF) signal from a radio transmitter, said power amplifying circuitry comprising:
   means for amplifying the RF signal to produce an output RF signal;
   means for applying to said amplifying means one of first and second supply voltages from separate first and second voltage sources, respectively, said second supply voltage having a magnitude greater than the magnitude of said first supply voltage;
   means coupled to said applying means for selecting one of a first set of levels when said first supply voltage is applied to said amplifying means and one of a second set of levels when said second supply voltage is applied to said amplifying means, said second set of levels including at least one level of greater magnitude than the magnitude of any level of said first set of levels; and
   means coupled to said selecting means and amplifying means for maintaining the output RF signal at said selected one of said first or second sets of levels.

2. The power amplifying circuitry according to claim 1, wherein said amplifying means includes at least first and second cascaded amplifiers.

3. The power amplifying circuitry according to claim 1, wherein said first voltage source is a battery and said applying means, selecting means and maintaining means are coupled to said battery.

4. The power amplifying circuitry according to claim 1, wherein said second voltage source is disposed in adaptor means, said applying means being removably couplable to said adaptor means.

5. The power amplifying circuitry according to claim 4, wherein said second voltage source is a battery.

6. The power amplifying circuitry according to claim 4, wherein said adaptor means includes voltage regulating means interposed between said second voltage source and said applying means.

7. The power amplifying circuitry according to claim 4, wherein said adaptor means includes charging means coupled to said second voltage source, said applying means further coupling said charging means to said first voltage source when said applying means is coupled to said adaptor means.

8. The power amplifying circuitry according to claim 1, wherein said selecting means is a microcomputer.

9. The power amplifying circuitry according to claim 1, wherein said maintaining means includes:
   first means coupled to the output RF signal for generating a control signal; and
   second means coupled to said control signal for generating a drive signal, said amplifying means coupled to said drive signal for varying the magnitude of the output RF signal in response thereto.

10. Power amplifying circuitry for a radio frequency (RF) signal from a radio transmitter having a first voltage source and being couplable to a second voltage source, said second voltage source providing a voltage having a magnitude greater than the magnitude of the voltage provided by said first voltage source, said power amplifying circuitry further comprising:
   means for amplifying the RF signal to produce an output RF signal;
   means for coupling said amplifying means to said second voltage source in place of said first voltage source;
   means for detecting the presence of said second voltage source;
   means for selecting one of a first set of levels when said second voltage source is not present and selecting one of a second set of levels when said second voltage source is present, said second set of levels including at least one level of greater magnitude than the magnitude of any level of said first set of levels; and
   means coupled to said selecting means and amplifying means for maintaining the output RF signal at said selected one of said first or second sets of levels.

11. The power amplifying circuitry according to claim 10, wherein said second voltage source is disposed in adaptor means, said power amplifying circuitry being removably couplable to said adaptor means.

12. The power amplifying circuitry according to claim 11, wherein said detecting means is inverting gate means having an input and control signal as an output and said coupling means couples signal ground from said adaptor means to said input of said inverting gate means, said inverting gate means control signal having a second state when said inverting gate input is grounded and a first state when said inverting gate input is not grounded, said selecting means selecting one of the first set of levels when the control signal has the first state and one of a second set of levels when the control signal has the second state.

13. Power amplifying circuitry including first amplifying means coupled to a first voltage source for amplifying a radio frequency (RF) signal from a radio transmitter to produce an output RF signal and first maintaining means for maintaining the magnitude of said output RF signal at a selected one of a first set of levels, said power amplifying circuitry couplable to second amplifying means coupled to a second voltage source for amplifying the output RF signal and second maintaining means for maintaining said amplified output RF signal at a selected one of a second set of levels, said second voltage source providing a voltage having a magnitude greater than than the magnitude of the voltage provided by said first voltage source, said first power amplifying circuitry further comprising:
   means for detecting the presence of said second amplifying means;
   means for selecting a predetermined one of said first set of levels when said second amplifying means is detected;
   means for selecting one of said second set of levels when said second amplifying means is detected, said second set of levels including at least one level of greater magnitude than the magnitude of any level of said first set of levels; and
   means for applying said selected one of said second set of levels to said second maintaining means.

14. Power amplifying circuitry for a radio frequency (RF) signal from a radio transmitter, said power amplifying circuitry comprising:
   means for amplifying the RF signal to produce an output RF signal;
   means for applying to said amplifying means one of first and second supply voltages from first and second voltage sources, respectively, said second supply voltage having a magnitude greater than the magnitude of the first supply voltage;
   means coupled to said applying means for producing a control signal having a first state when the first supply voltage is applied to said amplifying means and a second state when said second supply voltage is applied to said amplifying means;

means coupled to said producing means for selecting one of a first set of levels when the control signal has the first state and one of a second set of levels when the control signal has the second state, said second set of levels including at least one level of greater magnitude than the magnitude of any level of said first set of levels; and means coupled to said selecting means and amplifying means for maintaining the output RF signal at said selected one of said first or second sets of levels.

15. The power amplifying circuitry according to claim 14, wherein said second voltage source is disposed in adaptor means, said applying means being removably couplable to said adaptor means.

16. The power amplifying circuitry according to claim 15, wherein said producing means is inverting gate means having an input and said control signal as an output, said applying means coupling signal ground from said adaptor means to said input of the inverting gate means.

17. Power amplifying circuitry for a radio frequency (RF) signal from a radio transmitter having a first voltage source and being couplable to a second voltage source, said second voltage source providing a voltage having a magnitude greater than the magnitude of the voltage provided by said first voltage source, said power amplifying circuitry further comprising:

means for amplifying the RF signal to produce an output RF signal;

means for coupling said amplifying means to said second voltage source in place of said first voltage source;

means for detecting the presence of said second voltage source and producing a control signal having a first state when the first voltage source is coupled to said amplifying means and a second state when the second voltage source is coupled to said amplifying means;

means for selecting one of a first set of levels when the control signal has the first state and selecting one of a second set of levels when the control signal has the second state, said second set of levels including at least one level of greater magnitude than the magnitude of any level of said first set of levels; and means coupled to said selecting means and amplifying means for maintaining the output RF signal at said selected one of said first or second sets of levels.

18. The power amplifying circuitry according to claim 17, wherein said second voltage source is disposed in adaptor means, said power amplifying circuitry being removably couplable to said adaptor means.

19. The power amplifying circuitry according to claim 17, wherein said producing means is inverting gate means having an input and said control signal as an output, said coupling means coupling signal ground from said adaptor means to said input of said inverting gate means.

20. Power amplifying circuitry for a radio frequency (RF) signal from a radio transmitter, said power amplifying circuitry comprising:

means for amplifying the RF signal to produce an output RF signal, said amplifying means including at least first and second cascaded amplifiers, said first amplifier coupled to a first drive signal;

means for applying to said second amplifier a first supply voltage from a first voltage source or a second drive signal;

means coupled to said applying means for selecting one of a first set of levels when the first supply voltage is applied to said second amplifier and one of a second set of levels when the second drive signal is applied to said second amplifier, said second set of levels including at least one level of greater magnitude than the magnitude of any level of said first set of levels; and means coupled to said selecting means and amplifying means for maintaining the output RF signal at said selected one of said first or second sets of levels, said maintaining means further including detecting means coupled to the output RF signal for generating an output signal having a magnitude related to the magnitude of the output RF signal, first means coupled to said detecting means output signal for generating the first drive signal, second means coupled to said detecting means output signal and a second supply voltage from a second voltage source for generating the second drive signal, said second supply voltage having a magnitude greater than the magnitude of the first supply voltage, and said amplifying means varying the magnitude of the output RF signal in response to the first or second drive signals.

21. The power amplifying circuitry according to claim 20, wherein said second generating means includes control means coupled to said detecting means output signal and said selecting means for producing a control signal, and driver means coupled to said control signal and said second supply voltage for generating said second drive signal.

22. The power amplifying circuitry according to claim 21, wherein said second voltage source and said driver means are disposed in adaptor means, said applying means and said control means being removably couplable to said adaptor means.

23. The power amplifying circuitry according to claim 22, wherein said second voltage source is a battery.

24. The power amplifying circuitry according to claim 22, wherein said adaptor means includes charging means coupled to said second voltage source, said applying means further coupling said charging means to said first voltage source when said applying means is coupled to said adaptor means.

25. Power amplifying circuitry for a radio frequency (RF) signal from a radio transmitter, said power amplifying circuitry comprising:

means for amplifying the RF signal to produce an output RF signal, said amplifying means including at least first and second amplifiers coupled in series with one another, said first amplifier coupled to a first drive signal;

means for applying to said second amplifier a first supply voltage from a first voltage source or a second drive signal;

means coupled to said applying means for selecting one of a first set of levels when the first supply voltage is applied to said second amplifier and one of a second set of levels when the second drive signal is applied to said second amplifier, said second set of levels including at least one level of greater magnitude than the magnitude of any level of said first set of levels; and means coupled to said selecting means and amplifying means for maintaining the output RF signal at said selected one of said first or second sets of levels, said maintaining means further including detecting means coupled to the output RF signal for generating an output signal having a magnitude related to the magnitude of the output RF signal, means coupled to the detecting means output signal for generating first and second control signals, first driver means coupled to said first control signal for generating said first drive signal, second driver means coupled to said second control signal and a second supply voltage from a second voltage source for generating the second drive signal, said second supply voltage having a magnitude greater than the magnitude of the first supply voltage, and said amplifying means varying the magnitude of the output RF signal in response to the first or second drive signals.

26. The power amplifying circuitry according to claim 25, wherein said second voltage source and said second driver means are disposed in adaptor means, said applying means and said control means being removably couplable to said adaptor means.

27. The power amplifying circuitry according to claim 26, wherein said second voltage source is a battery.

28. The power amplifying circuitry according to claim 26, wherein said adaptor means includes charging means coupled to said second voltage source, said applying means further coupling said charging means to said first voltage source when said applying means is coupled to said adaptor means.

* * * * *